United States Patent [19]

Yeung et al.

[11] Patent Number: 4,649,346
[45] Date of Patent: Mar. 10, 1987

[54] COMPLEX QUOTIENT NUCLEAR MAGNETIC RESONANCE IMAGING

[75] Inventors: Hong-Ning Yeung, Richmond Heights; Chiiming Kao, Mayfield Heights; Arnold H. Lent, Macedonia, all of Ohio

[73] Assignee: Technicare Corporation, Cleveland, Ohio

[21] Appl. No.: 550,523

[22] Filed: Nov. 9, 1983

[51] Int. Cl.⁴ ............................................. G01R 33/24
[52] U.S. Cl. ..................................... 324/309; 324/312
[58] Field of Search ................. 324/300, 307, 309, 312

[56] References Cited

U.S. PATENT DOCUMENTS

| | | | |
|---|---|---|---|
| 4,015,196 | 3/1977 | Moore | 324/309 |
| 4,115,730 | 9/1978 | Mansfield | 324/309 |
| 4,595,879 | 6/1986 | Lent et al. | 324/309 |

FOREIGN PATENT DOCUMENTS

| | | |
|---|---|---|
| 2920549 | 4/1980 | Fed. Rep. of Germany . |
| 2091884 | 8/1982 | United Kingdom ................. 324/309 |
| 2102577 | 2/1983 | United Kingdom . |

OTHER PUBLICATIONS

A. Abragam; *The Principles of Nuclear Magnetism*, Oxford Univ. Press, London (1961), chapter 3.
Canet; Journal of Physics E vol. 9, No. 11, pp. 939-942, "Total Automation of Longitudinal Relaxation Time . . . ", Nov. 1976.
Goedde; Chemical Instrumentation vol. 7, No. 3, pp. 179-192, "A Computer Assisted Method For Measuring NMR Relaxation Times", 1976.
Kaufman; Nuclear Magnetic Resonance Imaging In Medicine, 1981, pp. 31-33.
Cho et al., Fourier Transform Nuclear Magnetic Resonance Tomographic Imaging, Proceedings of IEEE, vol. 70, No. 10, Oct. 1982.
Tropper, Image Reconstruction for the NMR Echo—Planar Technique, and for a Proposed Adaptation to Allow Continuous Data Acquisition, J. of Mag. Resonance, 42, 1981, pp. 193-202.
Brunner et al., Sensitivity and Performance Time in NMR Imaging, J. of Mag. Res. 33, 1979, pp. 83-106.
Kumar et al., NMR Fourier Zeugmatography, Journal of Magnetic Resonance, vol. 18, No. 1, Apr. 1975, pp. 69-83.
Inouye et al., A Method for $T_1$ Relaxation Time Computed Images, Society of Magnetic Resonance in Medicine, Second Annual Meeting, San Francisco, Aug. 1983.
Inouye et al., Experimental Results with a Whole Body NMR-CT Scanner Using a Resistive Magnet, Radiation Medicine, vol. 1, No. 1, Jan.-Mar. 1983.

*Primary Examiner*—Michael J. Tokar
*Assistant Examiner*—Scott M. Oldham
*Attorney, Agent, or Firm*—W. Brinton Yorks, Jr.

[57] ABSTRACT

In an NMR imaging system, an image plane is scanned and NMR signals are collected over a plurality of image lines. The experiment is repeated, with the timing of the excitation pulses changed. Images are formed by performing Fourier transformations of the signal values. A ratio image is then formed by performing a complex division of the two images on a pixel by pixel basis. The ratio values cancel phase error effects in the image data and the use of complex numbers maintains the proper pixel polarity.

12 Claims, 5 Drawing Figures

COMPLEX QUOTIENT NUCLEAR MAGNETIC RESONANCE IMAGING

This invention relates to nuclear magnetic resonance (NMR) imaging and, in particular, to the production of NMR image pixels formed of complex quotient values.

The NMR phenomenon deals with the interactions between a collection of nuclear magnetic moments subjected to externally applied magnetic fields. The nuclear magnetic moments result from the intrinsic angular momentum, also called spin, characteristic of atomic nuclei with an odd number of either protons or neutrons. The interaction of these nuclear magnetic moments in the presence of applied magnetic fields is, in general, complicated and follows the laws of quantum mechanics. A rudimentary description of the macroscopic behavior of the spins, manifested as experimental observables, is possible based on simple classical laws.

Consider a collection of nuclear spins immersed in a strong constant magnetic field Bo, which points along the z-axis of a Cartesian coordinate system. The motion experienced by each nuclear magnetic moment follows a rather complicated path which consists of precession about a net field which is the vector sum of the external field Bo and a local field $B_{loc}$ arising from its neighboring spins ($B_{loc} << Bo$). Individual nuclear magnetic moments cannot be experimentally observed. What is measurable is their statistical average over a macroscopic dimension, appropriately adjusted in accordance with the desired application. This macroscopic quantity of nuclear magnetic moment is called magnetization. Thus, NMR signals are measures of nuclear magnetization.

At thermal equilibrium, the magnetization, Mo, is parallel to Bo and its magnitude is proportional to Bo. However, so long as the magnetization remains parallel to Bo, there will be no macroscopic precession and as a result no electrical signal impressed upon the receiver coil. In order to derive NMR information, it therefore becomes necessary to apply an external, time-dependent magnetic field, directed orthogonally to the axis of Bo, the static magnetic field. Such a field is typically applied by the use of radio frequencies and is further applied at or close to the frequency of precession (Larmor frequency) in order to resonate with the nuclear spin system and hence drive the magnetization away from equilibrium. The RF field is turned on for a length of time sufficient to direct the bulk magnetization vector to an angle of, typically, 90° from the static field direction Bo. As a result, the bulk magnetization of nuclear fields precesses about Bo (the static field) in the transverse plane at the Larmor frequency. Detection of the magnetization of the nuclei as its transverse component relaxes back to equilibrium following an RF pulse, i.e., decays to zero, is termed a free induction decay.

In order to obtain spatially related information from the NMR signal, however, spatial information must be initially encoded into the NMR signal. This is accomplished by spatially varying the strength of the externally supplied Bo magnetic field, typically in a linear fashion. Thus, the Larmor frequency will be proportional to the field Bo and will also vary with position. Accordingly, the frequency spectrum, obtained by mathematical manipulation, provides an NMR signal distribution along a single axis and, by revolving the gradient magnetic field, multiple NMR frequency spectra corresponding to different projections of the object may be obtained. NMR images also can be formed by the Fourier Zeugmatography method proposed by Ernst et al. ("NMR Fourier Zeugmatography", A. Kumar, D. Welti, and R. Ernst, J. Mag. Resonance, 18, 69-83 (1975)). This method essentially uses frequency to encode information along one dimension by recording the NMR signal in the presence of a magnetic gradient field along that direction. In addition, to encode spatial information in a second direction, orthogonal to the first, a gradient magnetic field in that second direction is successively applied, in pulsatile form, for a short duration after the magnetization is brought to the transverse plane but prior to recording the NMR data. A multitude of data lines may thus be obtained, each of which carries phase-encoded information corresponding to Fourier components of the position coordinates along the direction whose spatial information is sought. By performing a two-dimensional Fourier transformation, one with respect to time and the other with respect to the phase-encoding gradient amplitude, a two-dimensional image is obtained.

Several types of signals may be employed for the formation of NMR images. One type is the free induction decay signal described above, which induces a small signal in the RF receiving coil of the NMR system as the transverse component of magnetization relaxes back to equilibrium following an RF excitation pulse.

A second type of NMR signal which may be induced is the spin-echo signal. A spin-echo signal is generated by first tipping the bulk magnetization vector through 90° to the transverse x'-y' plane of the rotating frame of reference. This is done by application of a so-called 90° pulse. During the following time period $\tau$ some of the individual isochromats in the x'-Y' plane begin to dephase and fan out as they precess at rates different than the rotation rate of the reference frame. The term "isochromat" refers to a group of spins which have the same Larmor frequency. After the period $\tau$ a 180° pulse is applied, the effect of which is to rotate the precessing isochromats in the x'-y' plane by 180°. After another time period $\tau$, the individual isochromats come back into phase coherence. The rephasing or refocussing of the isochromats and their subsequent defocussing produces a signal which peaks at the end of the second time period $\tau$, generating a time-symmetrical signal known as a spin-echo signal.

An NMR imaging system constructed in accordance with the principles of the present invention advantageously utilizes the time symmetry of the spin-echo signal by detecting the spin-echo signal during a period of time, or sampling "window" centered in time about the center of the spin-echo signal. The signal induced in the receiving RF coil is demodulated by two quadrature phase detectors. The orthogonal, phase-detected signals are sampled by an analog-to-digital converter, thereby producing two data values at each sampling point. The phase-detected data values may be taken as components of a complex number which represents the detected spin vector in the form $A \pm Bi$. In this form, the A term is a real term and the B term is an imaginary term. In order to form an image, the complex numbers are used in a Fourier transform process, which transforms the time domain information to the frequency domain, in which frequency encoding is used to represent the spatial location of nuclei in the material being imaged.

For time-domain data that possesses time-reversal symmetry, of which the NMR spin-echo signal is an example, the time-domain data is Hermitian if the spin-echo signal is properly time-centered in the sampling window. The frequency domain signal appears as a real function. An image can then be formed using so-called "magnitude" reconstruction, with total disregard of the phasing of the phase detected data values, since it can be shown for most classes of data that the magnitude reconstructed image is identical to the real image if the time-symmetrical spin-echo signal is time-centered in the sampling window.

However, phase and timing errors from various sources can cause the spin-echo signal to be mis-centered in the sampling window. It then becomes necessary to perform phase corrections in order to maintain a wholly real image. Unfortunately, it is not always easy, or in some cases, possible, to phase-correct the image data. Phase correction can be difficult because of the relative unpredictability of the phase error due to RF absorption or eddy-current effects induced by magnetic field-gradient switching.

Furthermore, phase-sensitive image reconstruction may be necessary even if the time domain data possesses time-reversal symmetry. For example, when data is obtained by inversion recovery, the spin magnetization components will normally exhibit both positive and negative polarity. Magnitude reconstruction, which involves the squaring of data values, will have the undesirable effect of artificially inverting all negative signs into positive signs. This will cause an intensity reversal in the image of what should be regions with negative polarity, and a display of an inaccurate image. Although the method of maximum entropy shows promise in solving the phase-corection problem in NMR spectroscopy, it is inapplicable to data obtained by inversion recovery, since one of the assumptions of the maximum entropy technique is that the reconstructed image contains no negative values. Accordingly, it is desirable to provide an NMR imaging system in which phase errors are circumvented in a relatively simple manner, and the polarity of negative image values is preserved to prevent brightness inversions in the reproduced image.

In accordance with the principles of the present invention, an NMR image is formed by producing a ratio of two NMR images. A first excitation pulse sequence is applied to the material being imaged, together with encoding signals such as gradient fields for spatial identity. The received NMR signals are detected, collected and 2-D Fourier transformed to form an image of complex pixel values of the form a +ib. A second excitation pulse sequence is applied using different pulse timings, together with the same encoding signals used during the first imaging sequence. A second image of complex pixel values is formed. A ratio image is then formed by performing a complex division of the two images on a pixel-by-pixel basis. By using the same signal conditions except for excitation pulse timing for the two images, substantially the same phase errors will be represented in the respective pixel values of the two images, which phase errors will cancel when the ratio of the image pixels is formed. By employing complex division of the pixel values, a result is obtained in the form of a modulus term times a phase factor, with the phase factor preserving the sign polarity of the received signal values. The ratio image can be displayed or used to produce an image representative of $T_1$ values in the image plane.

Figure 1:
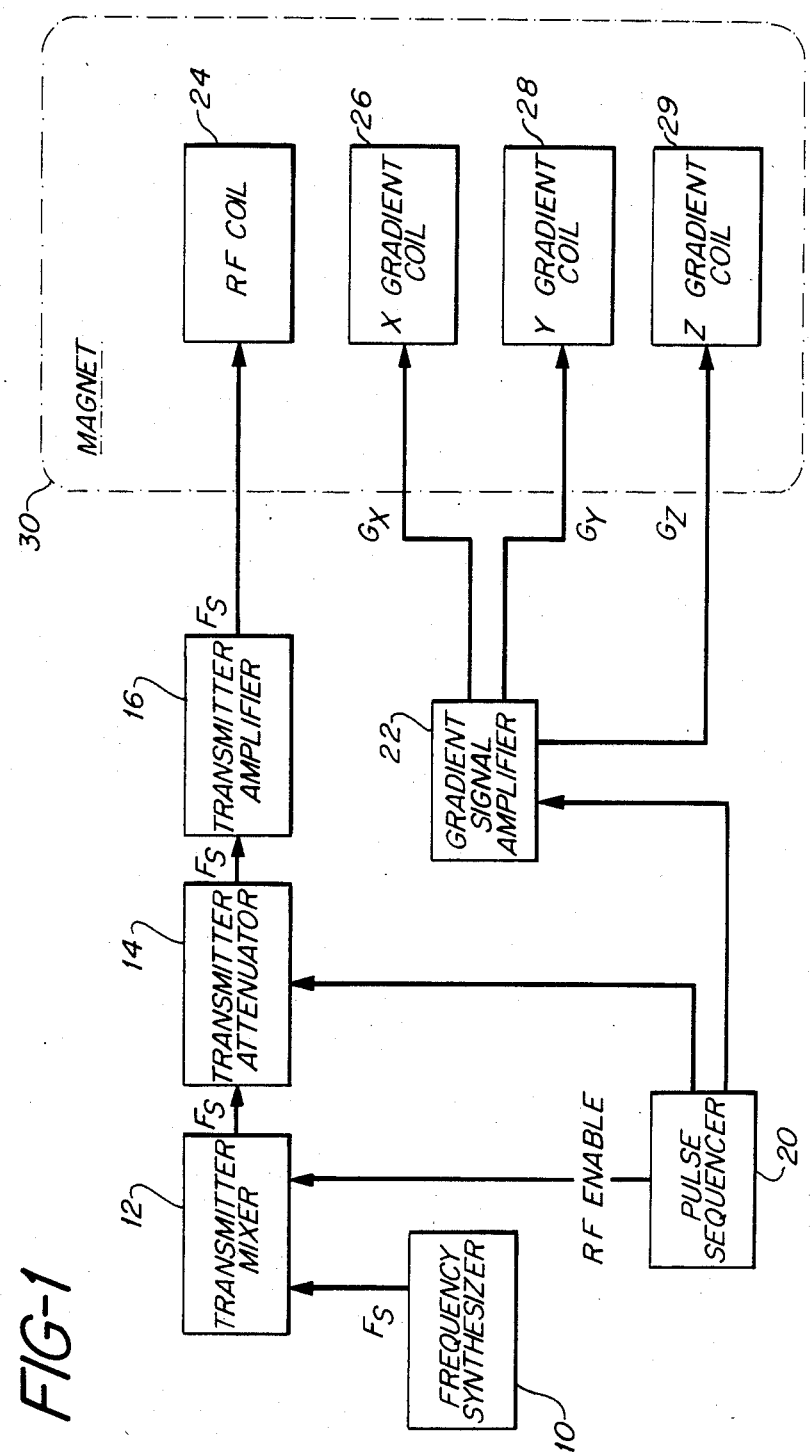
FIG. 1 illustrates in block diagram form, the transmission portion of an NMR imaging system.

Referring to FIG. 1, the transmission portion of an NMR imaging system is shown. A transmitter mixer 12 receives a signal $F_s$, where $F_s$ is the transmitted radio frequency NMR signal, from a frequency synthesizer 10. The $F_s$ signal is heterodyned by the mixer to produce the $F_s$ signal, which is coupled by way of a controlled transmitter attenuator 14 to a transmitter amplifier 16. The transmitter mixer 12 and attenuator 14 are controlled by control signals provided by a pulse sequencer 20, which applies an r.f. enable signal to the mixer 12. The $F_s$ signal is amplified by the amplifier 16 and applied to the r.f. coil 24 in the magnet 30 in the form of a sequence of pulses formed under control of the pulse sequencer 20. The r.f. coil 24 applies the $F_s$ pulses to the subject being imaged.

Also located within the field of the magnet 30 are x, y and z gradient coils 26, 28 and 29. These coils receive gradient control signals $G_x$, $G_y$ and $G_z$ from gradient signal amplifiers 22, which receive signals from the pulse sequencer 20.

Figure 2:
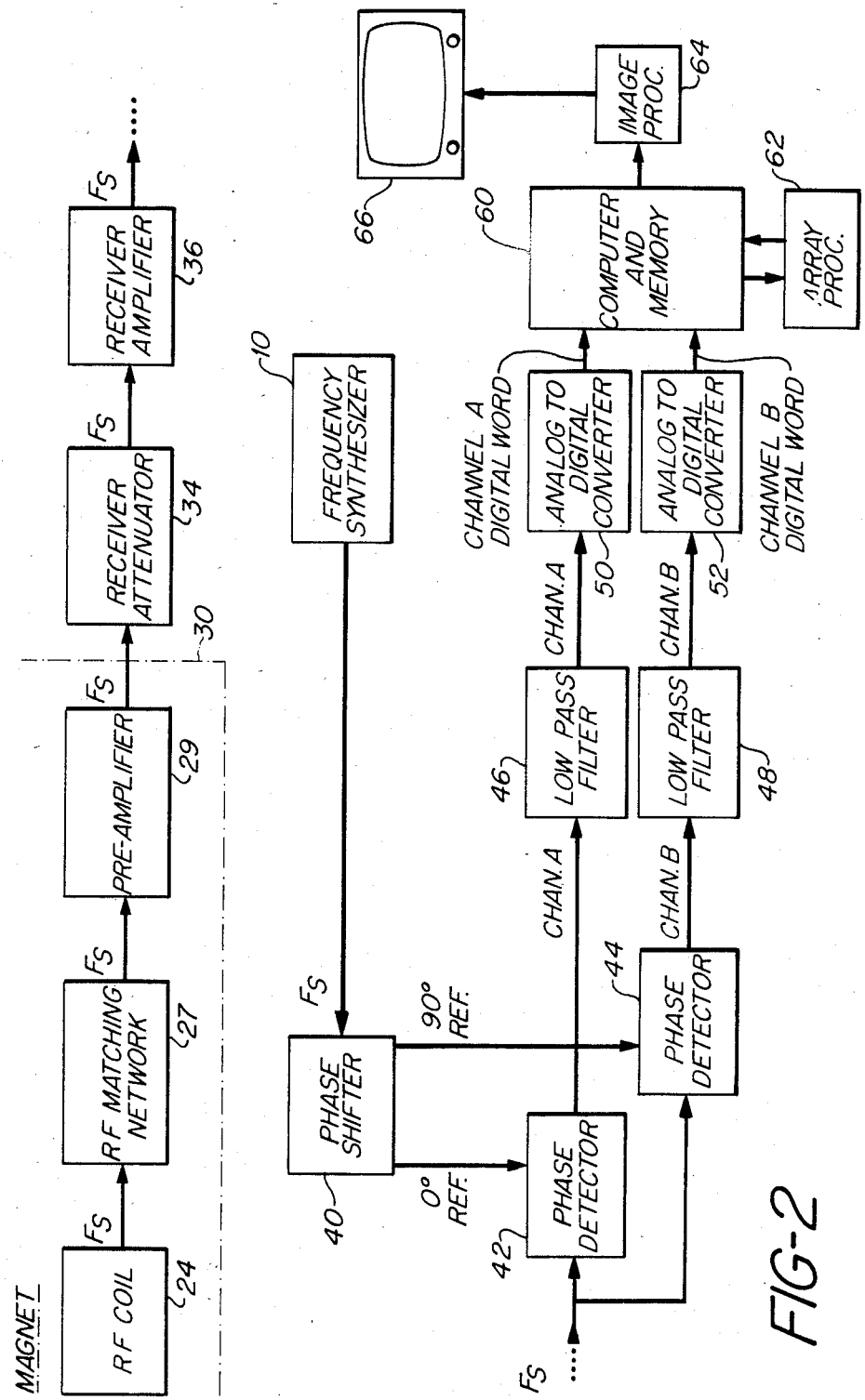
FIG. 2 illustrates in block diagram form, the receiver portion of an NMR imaging system constructed in accordance with the principles of the present invention.

The NMR signals emitted by the nuclei of the material being imaged induce $F_s$ return signals in the r.f. coil 24. These return signals are coupled by way of an r.f. matching network 27 and a pre-amplifier 29' to a receiver attenuator 34 as shown in FIG. 2. The received $F_s$ signals are amplified by an amplifier 36 and applied to quadrature phase detectors 42 and 44. The phase detectors receive two phase demodulating signals at, respectively, 0° and 90° phase angles from a phase shifter 40, which receives an $F_s$ reference signal from the frequency synthesizer 10. The phase detectors 42 and 44 produce a channel A signal and a channel B signal, respectively. The baseband A and B signals are filtered by respective low pass filters 46 and 48 and the filtered signals are then sampled by respective analog-to-digital converters 50 and 52. The resultant channel A and channel B digital words are stored in the memory of a computer 60. The channel A and B digital words are then combined and transformed to the frequency domain by a Fourier transform array processor 62. The resultant image signals are assembled in an image format by an image processor 64, and the processed image is displayed on a video monitor 66.

The NMR signals received by the arrangement of FIG. 2 represent the precessing tranverse component of the magnetization. The direction of the static magnetic field, Bo, is generally taken to be the z direction. The transverse component is then the component of magnetization lying in the x-y plane, the plane that is transverse to the z direction. The NMR signal is represented by a complex function, which can be thought of as a superposition of a collection of isochromats, each with a precessing frequency $\omega_\kappa = \omega_0 + \Omega_\kappa$, where $\Omega_\kappa$ is the incremental frequency component of the $\kappa^{th}$ isochromat. In a non-uniform field, different isochromats will exhibit spatially dependent frequencies, and the frequency spectrum of the NMR signal represents the spatial distribution of isochromats. The free decay signals can be represented mathematically by this superposition damped by a real envelope function $f_\kappa(t)$:

$$M_+ = M_x + iM_y = \sum_\kappa f_\kappa(t)\exp[i(\omega_o + \Omega_\kappa)t + \psi_\kappa] \quad (1)$$

where $\psi_\kappa$ is the phase angle of the $k^{th}$ isochromat.

The transverse component of magnetization is completely described by the quadrature detected signals produced by phase detectors 42 and 44 in FIG. 2. The transverse component can then be described as a vector in the complex plane, using the expression:

$$M = M_1 + iM_2 = M_+ e^{-i(\omega_o t + \phi)} \quad (2)$$

where $M_1$ and $M_2$ are the outputs of the two phase detectors and $\phi$ is the angle between the x'-y' coordinate system of the rotating frame of reference and the reference signal applied to phase detectors 42 and 44. The above equations are combined to give the detected signals as:

$$M = \sum_\kappa f_\kappa(t)\exp[i(\Omega_\kappa t + (\Psi_\kappa - \phi))] \quad (3)$$

Figure 3:
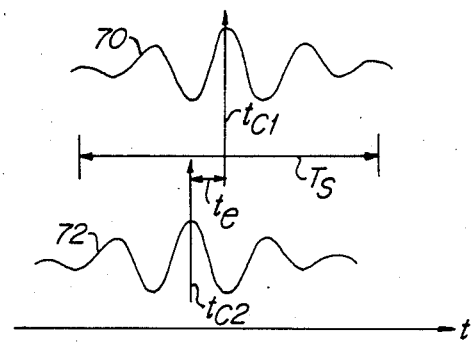
FIG. 3 illustrates the effect of timing errors upon the reception of an NMR signal.

The above expression describes the signal under ideal conditions when no phase or timing errors are involved. However, errors of this nature are to be expected and must be taken into consideration. The effect of these errors may be understood by referring to FIG. 3. In this FIGURE, a spin-echo signal 70 is illustrated. The spin-echo signal is to be detected and sampled during a data collection, or sampling period $T_s$. Ideally, the time center of the sampling period should be aligned with the time of occurrence of the center of the time-symmetrical spin-echo signal, $t_{c1}$. In the absence of phase and timing errors, the frequency domain signal should show the absorption spectrum (the real part) to be given by the cosine transform of the sampled data values, and the dispersion spectrum (the imaginary part) by the sine transform. However, phase errors, such as timing errors $t_e$ and phase angle errors $\phi_e$, usually referred to as first order and zero order phase errors, respectively, are generally unavoidable. The sources of these errors include: mis-settings of the magnetic field gradients used to refocus the spin-echo signals; delays in the switching times of magnetic field gradients caused by eddy currents induced by the metallic bore tube in the magnet; phase shifts introduced by filters, such as low pass filters 46 and 48 in FIG. 2; and by RF absorption through the material being imaged. An effect of these errors is illustrated by spin-echo signal 72 in FIG. 3, which is displaced from alignment with the center of the sampling period $T_s$ by timing error $t_e$.

Accordingly, these timing and phase angle errors must be represented in the signal expression, and the time domain signal, s(t), becomes:

$$s(t) = M_1 + iM_2 = \sum_\kappa f_\kappa(t)\exp\{i[\Omega_\kappa(t - t_e) + \psi_\kappa - \phi + \phi_e]\} \quad (4)$$

wherein $t_e$ is the timing error and $\phi_e$ is the phase angle error.

The above discussion describes error effects when recording a single NMR signal. In NMR imaging, a family of signals is recorded, then merged together to form a two- or three-dimensional image. For Fourier Zeumatography imaging, spatial information is gathered through phase encoding, which is provided for a 2D imaging experiment by incrementally varying the amplitude of a y gradient, $G_y$, transmitted by the y gradient coil 28 in FIG. 1. The $G_y$ signal is varied from line to line by steps $\Delta G_y$. By denoting the strength of a line gradient by the term $m\Delta G_y$, where m has the values 0, $\pm 1$, $\pm 2$, etc., the family of signals may be represented by the two-variable expression s(t,m). The time-domain signals s(t,m) are related to the frequency domain for spatial representation, using the imaging equation:

$$s(t, m) = K \int dx dy\, M_o(x, y)\exp(-t/T_2(x, y)) \cdot \quad (5)$$
$$\exp[i\gamma(m\Delta G_y y + G_x x t)]$$

There is a close correspondence between equations (1) and (5). The isochromat k in equation (1) is spatially located at point x,y in equation (5). The summation in (1) may be viewed as a discrete approximation to the integral in (5). The envelope function $f_\kappa(t)$ in equation (1) corresponds to the image function $M_o(x,y)\exp(-t/T_2(x,y))$ in equation (5). The remaining terms show that $\Omega_\kappa$ corresponds to $\gamma G_x x$, and $\psi_\kappa$ to $\gamma m\Delta G_y y$, revealing that the phase angle terms, $\psi_\kappa$, are functions of the gradient factor m at the coordinates x,y. Phase angle, and hence phase angle errors, are therefore seen to be position dependent in the NMR image and hence must be dealt with in a position-dependent manner. The imaging equation is then recast to include the effects of phase and timing errors, and becomes:

$$s_e(t, m) = K \int dx dy\, M_o(x, y)\exp(-t/T_2(x, y)) \cdot \quad (6)$$
$$\exp[i\gamma(G_x x(t - t_e) + m\Delta G_y y + \phi_e - \phi)]$$

where $s_e(t,m)$ is the measured, erroneous signal. The error in the image reconstructed from the measured signal is related to the true, error-free image by the expression:

$$M_{rec}(x,y) = M_o(x,y)\exp[-i\gamma(G_x x t_e + \phi_e - \phi)]) \quad (7)$$

where $M_{rec}(x,y)$ is the erroneous reconstructed image.

From the above equation (7), it is seen that the erroneous image is a complex image having both real and imaginary components, which may be expressed as C(x,y). A reconstructed image $M_{rec}(x,y)$ is thus a product of a true, error-free image $M_{true}(x,y)$ and the erroneous image, or $$M_{rec}(x,y) = C(x,y)M_{true}(x,y)$$

with the function C(x,y) introducing a phase error at each point of the image.

The complex nature of the error term can introduce inaccuracies in the reconstructed image depending upon how the NMR signals are acquired and the technique of image reconstruction. In the simplest case, when, for instance, the NMR signals are acquired by saturation recovery and an image is formed with a single set of image data, essentially no error is introduced. This is because signals acquired by saturation recovery should have no negative terms, and the error term should be a real number, with no imaginary components. Magnitude reconstruction can then be employed, with the error term $|C(x,y)|$ becoming equal to one, since the magnitude of the exponential of a real function will always equal one. It follows, then, that $$|M_{rec}(x,y)| = |M_{true}(x,y)|$$

and an essentially accurate image can be reproduced.

If, however, inversion recovery is used to acquire the NMR signals, both positive and negative terms can be expected. The complex error term will have both real and imaginary components, and magnitude reconstruction, which squares image values and takes the square root of sums of squared values, will result in the elimination of the polarity of the negative terms. Negative signals are forced to nonnegative values, which will be displayed as pixels with incorrect intensity.

Figure 5:
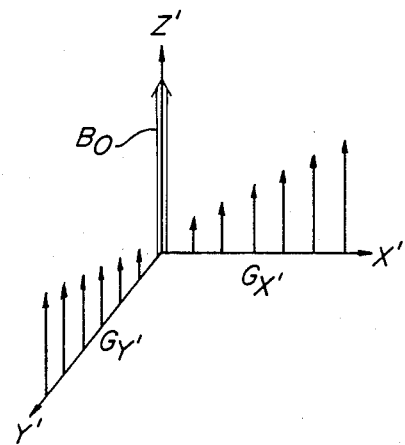
FIG. 5 is a vector diagram of gradient fields of the NMR imaging system of FIGS. 1 and 2.
Figure 4:
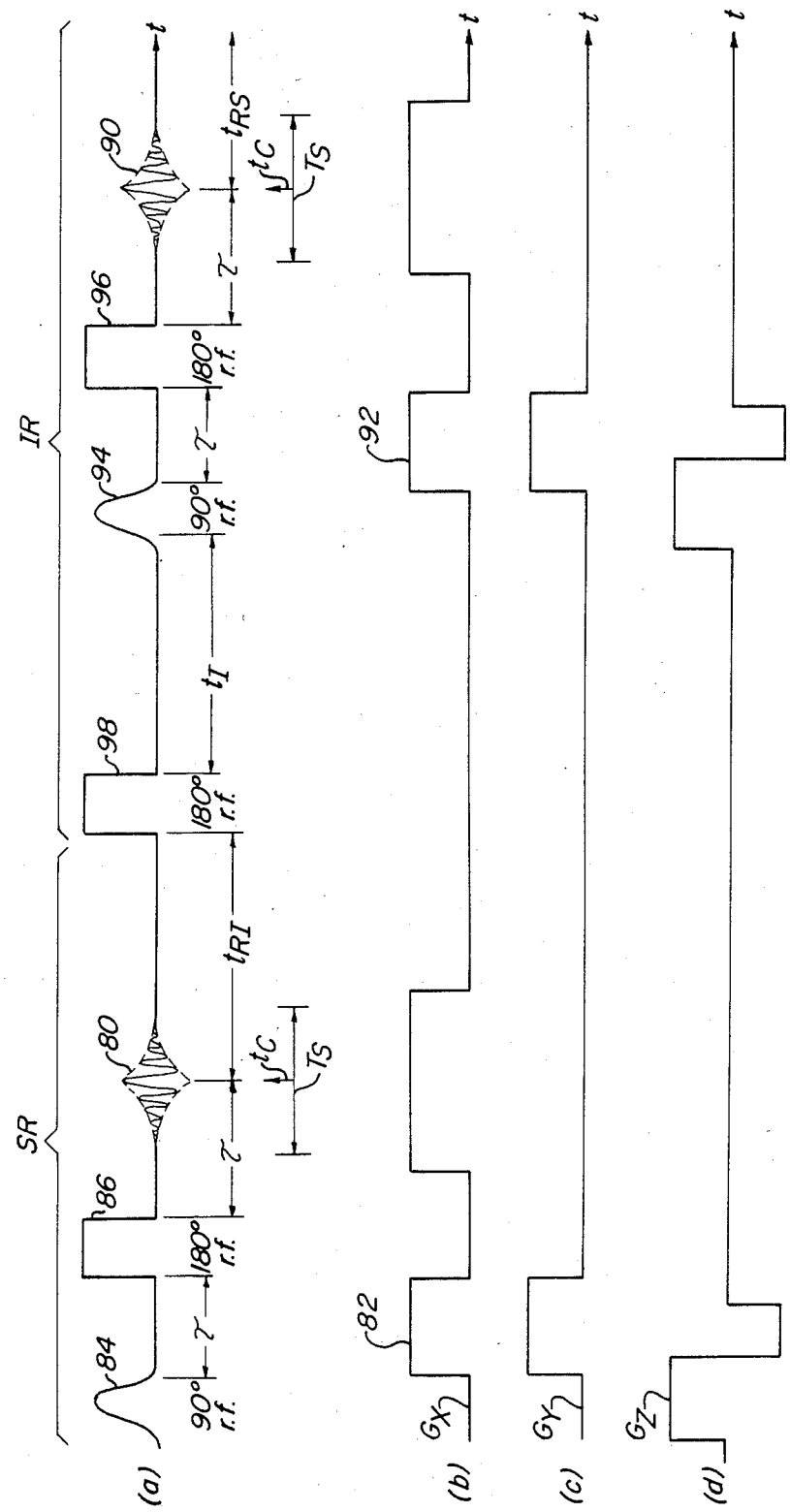
FIG. 4 illustrates a transmission sequence in accordance with the principles of the present invention.

Referring to FIG. 4, an excitation pulse sequence is shown for acquiring two sets of image data by saturation recovery and inversion recovery. FIGS. 4a, 4b, 4c and 4d are all drawn to the same time reference. In the saturation recovery subsequence, labelled SR, a "soft" 90 degree excitation pulse 84 is applied, followed by a time during which the individual isochromat vectors fan out in the transverse plane. A 180 degree pulse 86 is then applied, reversing the transverse vectors, which rephase after a subsequent period $\tau$ to form a spin-echo signal 80. The material being imaged is also subjected to an x gradient pulse $G_x$ during the first period $\tau$ and during the time that the spin-echo signal is formed, and a y gradient pulse $G_y$ is applied coincident in time with the first $G_x$ pulse. A z gradient pulse provides image plane selection. The x and y gradient field vectors are illustrated in the rotating frame of reference in FIG. 5. The spin-echo signal 80 is recovered during a sampling period $T_s$.

After formation of the spin-echo signal 80, the spin systems are allowed to recover for inversion recovery during time $t_{RI}$, and the inversion recovery subsequence IR is initiated by the application of a 180 degree pulse 98. After a period $t_I$ a spin echo signal 90 is produced by applying a soft 90 degree pulse 94 and a subsequent 180 degree pulse 96, each followed by a delay period $\tau$, with the spin-echo signal 90 peaking after the second delay period. Again, gradient signals $G_x$, $G_y$ and $G_z$ are applied following pulses 94 and 96, as was done during the saturation recovery subsequence. The spin systems are again allowed to recover during a period $t_{RS}$.

The sequence of FIG. 4 is repeated for each line in the reconstructed image, with a different y gradient value $G_y$ used for each line. The y gradient varies from line to line by $\Delta G_y$.

The phase-detected signals a and b acquired by saturation recovery are stored in a two-dimensional array in complex form, $A^s_j(t)+iB^s_j(t)$, where j represents the line numbers. The phase detected signals A and B acquired by inversion recovery are stored in a second two-dimensional array, also in complex form $A^{ir}_j(t)+iB^{ir}_j(t)$, where j again represents line numbers.

In the preferred embodiment of FIG. 2, the analog to digital converters 50 and 52 produce coefficients for 512 complex numbers in a line, and an image slice is formed of 129 lines. A two-dimensional Fourier transformation is then performed with respect to time and the number of lines, j. The Fourier transformation may be represented as:

$$M(x,y) \approx \sum_j \sum_t \exp \frac{-2\pi i(xt + yj)}{N_{samples} N_{lines}} (A_j(t) + iB_j(t))$$

to form a complex value at each image pixel location x,y. The Fourier transformation is performed on both data sets, the saturation recovery data set and the inversion recovery data set. The resultant images are:

$$M_s(x,y) = R_s(x,y) + iI_s(x,y)$$

and $$M_{ir}(x,y) = R_{ir}(x,y) + iI_{ir}(x,y)$$

where R values are real, I values are imaginary, and the subscripts refer to saturation and inversion recovery, respectively.

In accordance with the principles of the present invention, the effects of error sources at each pixel location are eliminated by forming a ratio image formed by performing a complex division of the two data sets on a pixel-by-pixel basis. From the preceding analysis it was shown that timing and phase errors are position-dependent. Therefore, since the same set-up values, including gradient values $G_x$, $G_y$ and $G_z$, were used during each excitation of a particular set of isochromats, corresponding pixels will exhibit the same phase and timing errors during saturation and inversion recovery. Performing complex division on a pixel-by-pixel basis will thus result in a cancellation of these errors in the ratio value at each pixel location. Mathematically, this complex division is accomplished by representing the data sets in simplified form, $M_{ir}=R_{ir}+iI_{ir}$ and $M_s=R_s+iI_s$. The complex ratio is then $$\frac{M_{ir}}{M_s} = \frac{R_{ir} + iI_{ir}}{R_s + iI_s}$$

The value of this ratio is unchanged by multiplication with the quantity $(R_s-iI_s)/(R_s-iI_s)$, and terms are collected to yield the result $$\frac{M_{ir}}{M_s} = \frac{R_{ir}R_s + I_{ir}I_s + i(I_{ir}R_s - R_{ir}I_s)}{R_s^2 + I_s^2}$$

Since the imaginary function $i(I_{ir}R_s-R_{ir}I_s)$ is ideally zero, and practically negligible, it is deleted and the remaining expression is used for display of the pixel value. The pixel value preserves the negative terms of inversion recovery data, thereby preventing inversion of brightness values in the image.

The ratio image can also be used to form an image representative of $T_1$ values. Representing the ratio as Ratio=$M_{ir}/M_s$, where $M_{ir}$ is the magnetization at each inversion recovery pixel and $M_s$ is the magnetization at each saturation recovery pixel, the Bloch equations are solved for $M_{ir}$ and $M_s$ to obtain:

$$\text{Ratio} = \frac{1 - (2 - \exp(-t_{RI}/T_1))\exp(-t_I/T_1)}{1 - \exp(-t_{RS}/T_1)}$$

The timing values $t_{RI}$, $t_{RS}$ and $t_I$ are found in FIG. 4a from the timing sequence of the excitation pulses. Since both the inversion recovery and saturation recovery data have the same dependence on $T_2$, this $T_2$ dependence cancels when the ratio is formed. The different timings of the two subsequences result in the ratio being an implicit function of $T_1$. Therefore, the above equation can be solved for $T_1$ by an iterative procedure such as the Newton method, or by a look-up table in which there is a $T_1$ value for each ratio value.

What is claimed is:

1. In a nuclear magnetic resonance imaging system, including a magnet for producing a magnetic field in which an imaging subject is to be located, a radio frequency coil and a gradient field coil, apparatus comprising:

means for collecting a first sequence of NMR signals, including means for applying a first excitation pulse sequence, means for applying a given gradient field, and means for detecting and storing said first sequence of NMR signals;

means for collecting a second sequence of NMR signals, including means for applying a second excitation pulse sequence, means for applying said given gradient field, and means for detecting and storing said second sequence of NMR signals;

means for performing a two-dimensional Fourier transform of said first and second sequences, respectively, to form first and second images having data values at spatially defined image locations; and means for forming a ratio of data values of said first and second images at each spatially defined image location.

2. The nuclear magnetic resonance imaging system of claim 1, wherein said first and second images formed by Fourier transformation each comprises an array of complex pixel values; and wherein said means for forming a ratio of data values performs a complex division of said first and second images on a pixel-by-pixel basis.

3. The nuclear magnetic resonance imaging system of claim 2, wherein said given gradient field extends in two dimensions.

4. The nuclear magnetic resonance imaging system of claim 3, wherein said first and second excitation pulse sequences differ in the respective timings of the excitation pulses.

5. In a nuclear magnetic resonance imaging system, including a magnet for producing a magnetic field in which an imaging subject is to be located, a radio frequency coil and a gradient field coil, apparatus comprising:

means for collecting a first sequence of NMR signals, including means for applying a first excitation pulse sequence, means for applying a given gradient field, and means for detecting and storing said first sequence of NMR signals;

means for collecting a second sequence of NMR signals, including means for applying a second excitation pulse sequence, means for applying said given gradient field, and means for detecting and storing said second sequence of NMR signals;

means for performing a two-dimensional Fourier transform of said first and second sequences, respectively, to form first and second images having data values at spatially defined image locations; and means for forming a ratio of data value of said first and second images at each spatially defined image location.

wherein said given gradient field extends in two-dimensions; and wherein said first excitation pulse sequence acquires NMR signals by saturation recovery, and wherein said second excitation pulse sequence acquires NMR signals by inversion recovery.

6. The nuclear magnetic resonance imaging system of claim 5, wherein each ratio value comprises the complex ratio of an inversion recovery pixel value divided by a saturation recovery pixel value.

7. The nuclear magnetic resonance imaging system of claim 6, wherein said means for forming a ratio of data values forms a ratio image in which each pixel includes a real part and an imaginary part; and further including:

means for displaying an image of the real parts of said ratio image.

8. The nuclear magnetic resonance imaging system of claim 5, wherein said first image includes a magnetization value $M_s$ at each saturation recovery pixel, and said second image includes a magnetization value $M_{ir}$ at each inversion recovery pixel; and further comprising:

means for solving the Block equations for $M_{ir}$ and $M_s$ to form a $T_1$ dependent ratio expresion; and means for solving said $T_1$ dependent ratio expression for $T_1$.

9. In a nuclear magnetic resonance imaging system, a method for reducing the effects of phase errors in an NMR image comprising the steps of:

(a) collecting a first sequence of NMR signals by applying a first excitation pulse sequence and a given gradient field and detecting and storing said first sequence of NMR signals;

(b) collecting a second sequence of NMR signals by applying a second excitation pulse sequence and said given gradient field and detecting and storing said second sequence of NMR signals;

(c) performing at least a two-dimensional Fourier transformation of said first and second sequences, respectively, to form first and second spatially representative images of complex pixel values; and (d) forming a ratio of said complex pixel values at each corresponding image location.

10. In a nuclear magnetic resonance imaging system, a method for reducing the effects of phase errors in an NMR image comprising the steps of:

(a) collecting a first sequence of NMR signals by applying a first excitation pulse sequence and a given gradient field and detecting and storing said first sequence of NMR signals;

(b) collecting a second sequence of NMR signals by applying a second excitation pulse sequence and said given gradient field and detecting and storing said second sequence of NMR signals;

(c) performing at least a two-dimensional Fourier transformation of said first and second sequences, respectively, to form first and second spatially representative images of complex pixel values; and (d) forming a ratio of said complex pixel values at each corresponding image location, wherein step (a) comprises collecting a sequence of NMR signals by saturation recovery, step (b) comprises collecting a sequence of NMR signals by inversion recovery, and step (d) comprises forming a complex ratio of a complex inversion recovery pixel divided by a complex saturation recovery pixel at each corresponding image location.

11. The method of claim 10, further comprising a step (e) of presenting an image of the real number portions of each complex ratio value.

12. The method of claim 10, further comprising the steps of:

(e) solving the Block equations for the inversion recovery and saturation recovery pixel values to obtain a $T_1$ dependent ratio expression; and (f) solving said $T_1$ dependent ratio expression for $T_1$.

* * * * *